US011251214B2

(12) United States Patent
Lämsä

(10) Patent No.: US 11,251,214 B2
(45) Date of Patent: Feb. 15, 2022

(54) ASYMMETRICALLY POSITIONED GUARD RING CONTACTS (71) Applicant: Detection Technology Oy, Oulu (FI)

(72) Inventor: Vili Lämsä, Oulu (FI)

(73) Assignee: DETECTION TECHNOLOGY OY, Oulu (FI)

( * ) Notice: Subject to any disclaimer, the term of this patent is extended or adjusted under 35 U.S.C. 154(b) by 0 days.

(21) Appl. No.: 16/480,366

(22) PCT Filed: Jan. 25, 2018

(86) PCT No.: PCT/EP2018/051767
§ 371 (c)(1),
(2) Date: Jul. 24, 2019

(87) PCT Pub. No.: WO2018/138176
PCT Pub. Date: Aug. 2, 2018

(65) Prior Publication Data
US 2019/0386055 A1 Dec. 19, 2019

(30) Foreign Application Priority Data
Jan. 27, 2017 (EP) ..................... 17153477

(51) Int. Cl.
*H01L 27/14* (2006.01)
*H01L 27/146* (2006.01)
(Continued)

(52) U.S. Cl.
CPC ...... *H01L 27/14636* (2013.01); *H01L 23/585* (2013.01); *H01L 27/14603* (2013.01);
(Continued)

(58) Field of Classification Search
CPC ............. H01L 23/585; H01L 27/14603; H01L 27/14636; H01L 27/14659; H01L 31/02005; H01L 31/02966
See application file for complete search history.

(56) References Cited

U.S. PATENT DOCUMENTS 5,227,635 A * 7/1993 Iwanczyk ............... G01T 1/241
250/336.1
5,677,539 A * 10/1997 Apotovsky ............. G01T 1/241
250/370.13
(Continued)

FOREIGN PATENT DOCUMENTS

GB 2289983 A 12/1995
JP 2000-507401 A 6/2000
(Continued)

OTHER PUBLICATIONS

English language Abstract of JP2004303878.
English translation of JP 2002-090462A.
English translation of JP 2003-046075A.

*Primary Examiner* — Jay C Kim
(74) *Attorney, Agent, or Firm* — Ware, Fressola, Maguire & Barber LLP (57) ABSTRACT According to an embodiment, a device comprises a direct conversion compound semiconductor layer configured to convert high energy radiation photons into an electric current, the direct conversion compound semiconductor layer comprising: a pixel array positioned in the direct conversion compound semiconductor layer, including pixels located at an outermost circumference, wherein the pixels comprise signal pads; a guard ring encircling the pixel array, wherein the pixels at the outermost circumference are closest to the guard ring; guard ring contact pads, wherein the guard ring contact pads are situated in place of some of the pixel signal pads at the outermost circumference and connected to the (Continued)

guard ring; wherein the guard ring contact pads are further situated asymmetrically with respect to a symmetry x-axis and a symmetry y-axis of the direct conversion compound semiconductor layer. Other embodiments relates to a detector comprising an array of tiles according to the device, and an imaging system comprising: an x-ray source and the detector.

19 Claims, 11 Drawing Sheets

(51) Int. Cl.
    *H01L 23/58*     (2006.01)
    *H01L 31/02*     (2006.01)
    *H01L 31/0296*     (2006.01)

(52) U.S. Cl.
    CPC .. *H01L 27/14659* (2013.01); *H01L 31/02005* (2013.01); *H01L 31/02966* (2013.01)

(56) References Cited

U.S. PATENT DOCUMENTS

| | | | | |
|---|---|---|---|---|
| 5,943,388 A * | 8/1999 | Turner | ............... | G01V 5/0041 378/98.11 |
| 6,002,134 A * | 12/1999 | Lingren | ............ | H01L 27/14659 250/370.01 |
| 6,037,609 A | 3/2000 | Liu et al. | | |
| 6,333,504 B1 * | 12/2001 | Lingren | ............ | H01L 27/14659 250/370.01 |
| 6,380,528 B1 * | 4/2002 | Pyyhtia | ............... | H04N 5/3696 250/208.1 |
| 6,465,824 B1 * | 10/2002 | Kwasnick | ........ | H01L 27/14603 257/233 |
| 6,928,144 B2 * | 8/2005 | Li | .............. | A61B 6/032 250/370.09 |
| 7,391,845 B2 * | 6/2008 | Konno | ............... | A61B 6/032 250/208.1 |
| 8,063,380 B2 * | 11/2011 | Levin | ............. | H04N 5/32 250/370.13 |
| 8,120,683 B1 * | 2/2012 | Turner | ............... | H04N 5/32 348/295 |
| 8,492,805 B2 * | 7/2013 | Akiyama | ............. | H01L 31/18 257/291 |
| 9,171,968 B2 * | 10/2015 | Oka | .................... | H01L 23/562 |
| 9,177,981 B2 * | 11/2015 | Nishizawa | ........ | H01L 27/14618 |
| 9,385,149 B2 * | 7/2016 | Rohr | .................. | H01L 27/14687 |
| 9,478,601 B2 * | 10/2016 | Tomita | .............. | H01L 23/585 |
| 9,520,430 B2 * | 12/2016 | Mizuta | ............. | H01L 27/14687 |
| 9,520,440 B2 * | 12/2016 | Tomita | ............. | H01L 27/14636 |
| 9,691,719 B2 * | 6/2017 | Tomita | ............. | H01L 23/53295 |
| 10,636,834 B2 * | 4/2020 | Meylan | ............... | A61B 6/4233 |
| 2007/0072332 A1 * | 3/2007 | Kemmer | ........... | H01L 27/14603 438/56 |
| 2011/0006389 A1 * | 1/2011 | Bachman | ............ | H01L 23/3128 257/508 |
| 2015/0069252 A1 | 3/2015 | Eichenseer | | |
| 2016/0148965 A1 * | 5/2016 | Clayton | ........... | H01L 27/14659 257/293 |

FOREIGN PATENT DOCUMENTS

| | | |
|---|---|---|
| JP | 2002-090462 A | 3/2002 |
| JP | 2002-508634 A | 3/2002 |
| JP | 2003-046075 A | 2/2003 |
| JP | 2004303878 A | 10/2004 |
| JP | 2012-503190 A | 2/2012 |
| WO | 98/32173 | 7/1998 |
| WO | 99/49650 | 9/1999 |
| WO | 2010/034619 A1 | 4/2010 |

* cited by examiner

ASYMMETRICALLY POSITIONED GUARD RING CONTACTS

BACKGROUND

Direct conversion compound semiconductor based detectors and detector arrays are utilized in radiation imaging in order to convert high energy radiation, for example x-ray photons, directly into electric charges. They are typically comprised of an x-ray photoconductor layer grown directly on top of a charge collector and a readout layer (such as room temperature semi-conductors). The detectors are commonly utilized in arrays of multiple tiles such that an increased image size with improved resolution may be generated.

The performance of the detectors, especially the peripheral tile elements, can be important to many imaging applications. Linearity, uniformity, stability, and consistency may be relevant for peripheral tiles. For many applications, the imaging requirements can be very stringent. For tiled imaging detectors built with room temperature semiconductors, the edges of each tile can cause significant non-uniformity or visible artifacts. This is known to arise due to much higher leakage current and a distorted electric field near the edges. Artifacts around the edges of the tiles may be undesirable. These artifacts are believed to be caused by degraded performance of the edge pixels.

It is known that a guard ring may be utilized to improve peripheral pixel behavior. The guard ring is typically made on the same surface of the pixellated side of the detector and applies the same electric potential as its neighbor, for example ground. The guard ring is connected to the ground via a guard ring contact pad. Therefore, the electric field distortion to the edge pixels is reduced or eliminated, depending on the size of the guard ring. Furthermore, the side wall leakage current is collected by the guard ring. However, the co-planar guard ring generates an inactive spatial region, i.e. a dead pixel with a dimension of the guard ring geometry. Furthermore, the guard ring contact pad will create an additional dead pixel. These are undesirable for tiled detector boundaries or detector edges which can have limited tolerance to the inactive space. Digital image processing may not be able to correct these, or it is too costly or cumbersome to do it.

Publication D1 discloses information that may be regarded as useful for understanding the background.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object to provide asymmetrically positioned guard ring contacts. The object is achieved by the features of the independent claims. Some embodiments are described in the dependent claims. According to an embodiment, a device comprises a direct conversion compound semiconductor layer configured to convert high energy radiation photons into an electric current, the direct conversion compound semiconductor layer comprising: a pixel array positioned in the direct conversion compound semiconductor layer, including pixels located at an outermost circumference, wherein the pixels comprise signal pads; a guard ring encircling the pixel array, wherein the pixels at the outermost circumference are closest to the guard ring; guard ring contact pads, wherein the guard ring contact pads are situated in place of some of the pixel signal pads at the outermost circumference and connected to the guard ring; wherein the guard ring contact pads are further situated asymmetrically with respect to a symmetry x-axis and a symmetry y-axis of the direct conversion compound semiconductor layer.

Other embodiments relates to a detector comprising an array of tiles according to the device, and an imaging system comprising: a high energy radiation source and the detector.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings.

DETAILED DESCRIPTION

The detailed description provided below in connection with the appended drawings is intended as a description of the embodiments and is not intended to represent the only forms in which the embodiment may be constructed or utilized. However, the same or equivalent functions and structures may be accomplished by different embodiments.

In an imaging array, adjacent non-conforming pixels may not be allowed, because software, SW, based interpolation may not work to remove them from the final image. In tile based imaging arrays, a dead area between the tiles creates dead pixel zones, which is from a SW point of view described as a dead row of pixels. Any dead pixel on an outer edge of the actual tile pixel matrix will create an adjacent dead pixel to the dead zones between tiles.

Typically, detectors require a guard ring, which is located between the pixel matrix and an outer edge of the detector semiconductor crystal. The guard ring needs a separate ground-bias contact as compared to the pixels. When the guard ring ground is symmetrical in the detector crystal, a size of a three dead pixels' cluster may be established. The first dead pixel is situated at the outer edge of the pixel array of the first tile. The second dead pixel is situated at the area between the tiles, and the third one is situated at an outer edge of the pixel array of the second tile. Consequently, a minimum of three interpolations are needed to hide the cluster of the dead pixels, which deteriorates the final image quality.

According to an embodiment the guard ring contact pads are configured asymmetrically, unsymmetrically, with respect to x and y symmetry axes of the tile of the detector. The guard ring contact pad may be alternatively referred to as a guard ring contact pixel, so that the pixel illustrates an area with respect to imaging and the pad represents an area with respect to an electrical contact. Each edge of the tile comprises at least one guard ring contact pad, which is configured at the outer circumference of the pixel array. When the guard ring contact pads are configured asymmetrically with respect to each other in view of the x and y symmetry axes of the tile, the guard ring contact pixels between neighboring tiles do not coincide and are not situated face to face.

Consequently, no cluster of three dead pixels is created. Furthermore, the tile may be freely rotated by 360 degrees in the assembly stage without the possibility of creating the cluster of three guard ring dead pixels. There is less need for error correction. Furthermore, the configuration may be error proof for the assembly process of the detector crystal.

Although the embodiments may be described and illustrated herein as being implemented in a direct conversion compound semiconductor, this is only an example implementation and not a limitation. As those skilled in the art will appreciate, the present embodiments are suitable for application in a variety of different types of detector semiconductor crystals such as Cadmium telluride (CdTe), Cadmiun Zink Telluride CdZnTe, etc.

Figure 1:
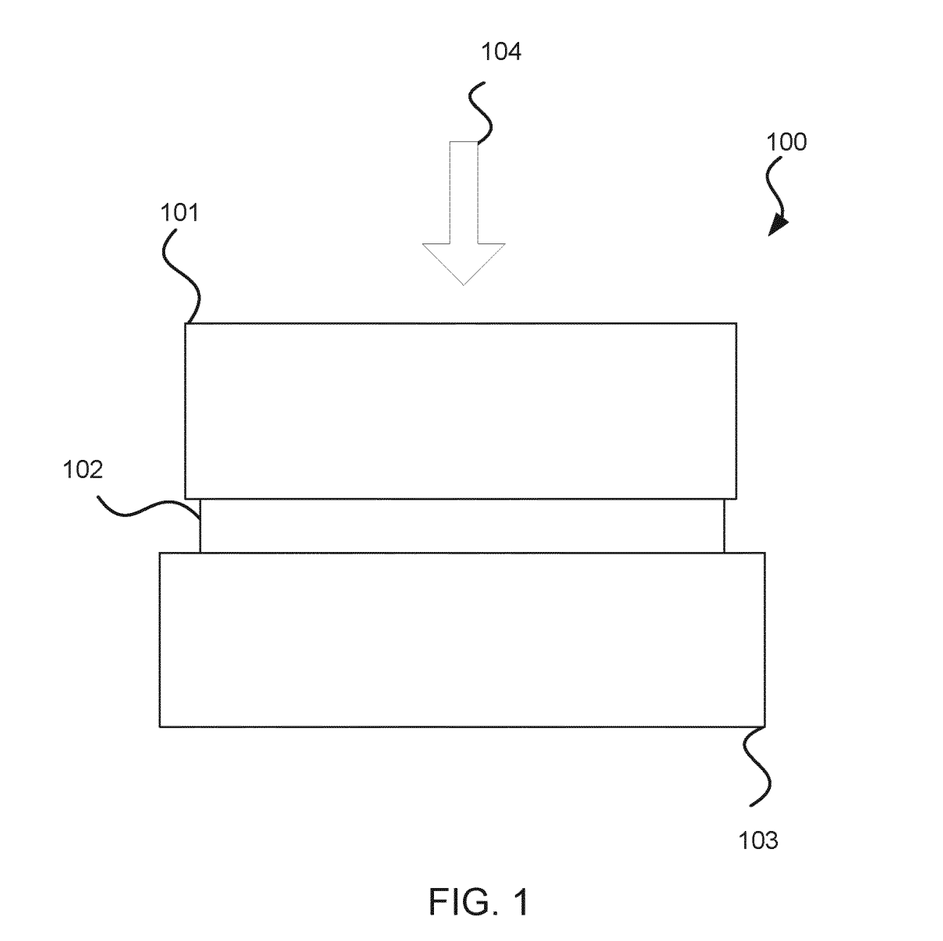
FIG. 1 illustrates a schematic representation of a cross section of a tile showing a direct conversion compound semiconductor layer, an integrated circuit layer, and a substrate layer according to an embodiment.

FIG. 1 illustrates a schematic representation of a cross section of a tile 100 in a z-axis (not shown in FIG. 1) direction showing a direct conversion compound semiconductor layer 101, an integrated circuit (IC) layer 102, and a substrate layer 103 according to an embodiment.

The direct conversion compound semiconductor layer 101 may be also referred to as a detector semiconductor crystal or a compound semiconductor. It is configured to convert high energy radiation such as x-ray photons into corresponding electronic currents that may be detected. The compound semiconductor layer 101 is the uppermost layer of the tile 100. The compound semiconductor layer 101 receives x-ray radiation 104. It should be noted that instead of x-rays, gamma ray radiation may be received. Under the compound semiconductor layer 101 there is the IC layer 102. The IC layer 102 may be an application-specific integrated circuit (ASIC). The ASIC may include microprocessors, memory blocks including ROM, RAM, EEPROM, flash memory and other large building blocks. This kind of ASIC is often termed a SoC (system-on-chip). It may be configured using a hardware description language (HDL), such as Verilog or VHDL, to describe the functionality of ASICs. Instead of an ASIC, Field-programmable gate arrays (FPGA) may be used as programmable logic blocks and programmable interconnects allowing the same FPGA to be used in many different applications. The IC layer 102 includes an electrical ground in addition to the other electronics. The lowermost layer is a substrate layer 103. The substrate (also referred to as a wafer) may be a solid (usually planar) substance, onto which a layer of another substance is applied, and to which that second substance adheres. The substrate 103 may be a slice of material such as silicon, silicon dioxide, aluminum oxide, sapphire, germanium, gallium arsenide (GaAs), an alloy of silicon and germanium, or indium phosphide (In P). These serve as the foundation upon which the IC electronic devices such as transistors, diodes, and especially integrated circuits (ICs) are deposited.

The compound semiconductor 101, the IC 102 and the substrate 103 establish a tile 100. One tile has an array of pixels, and each pixel corresponds to a signal pad on the compound semiconductor in digital imaging in the detector. The detector has an array (alternatively referred to as a matrix) of tiles 100.

Figure 2:
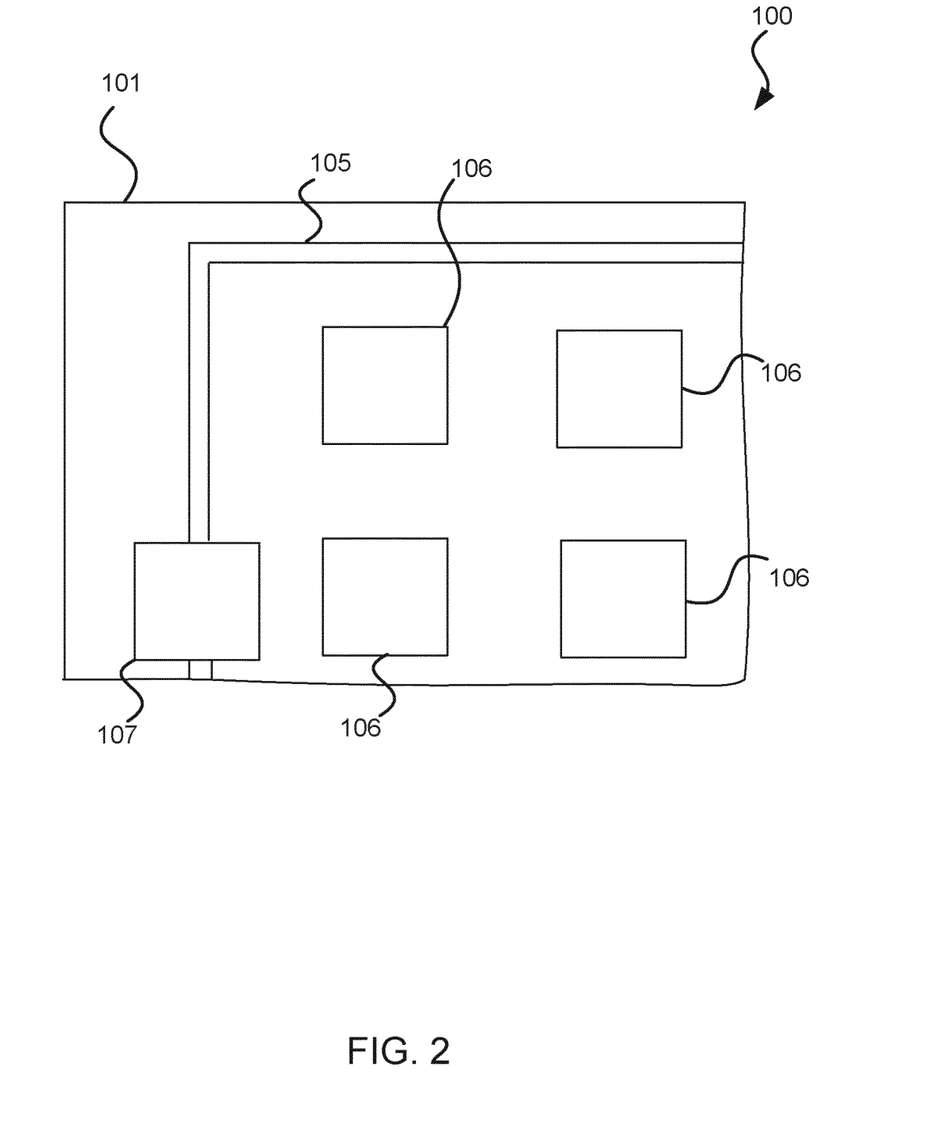
FIG. 2 illustrates a schematic representation of a top view of a tile corner according to a comparative example.

FIG. 2 illustrates a schematic representation of a top view of a tile corner according to a comparative example. The direct conversion compound semiconductor layer 101 comprises signal pads 106 (alternatively referred to as pixel pads) in the array, a guard ring 105 encircling the pixel array. In the comparative example, a guard ring contact pad 107 is configured to be situated on the guard ring 105. This may increase the size of the dead zone and the amount of the dead pixels, because the guard ring 105 may not be configured close to the edge of the side of the direct conversion compound semiconductor layer 101. A certain tolerance and safety distance needs to be maintained between the edge and the object, which in this example is on the left side of the pad 107.

The signal pads 106 and the guard ring pad 107 connect to the IC layer 102 and electronics thereof through the semiconductor compound 101.

Figure 3:
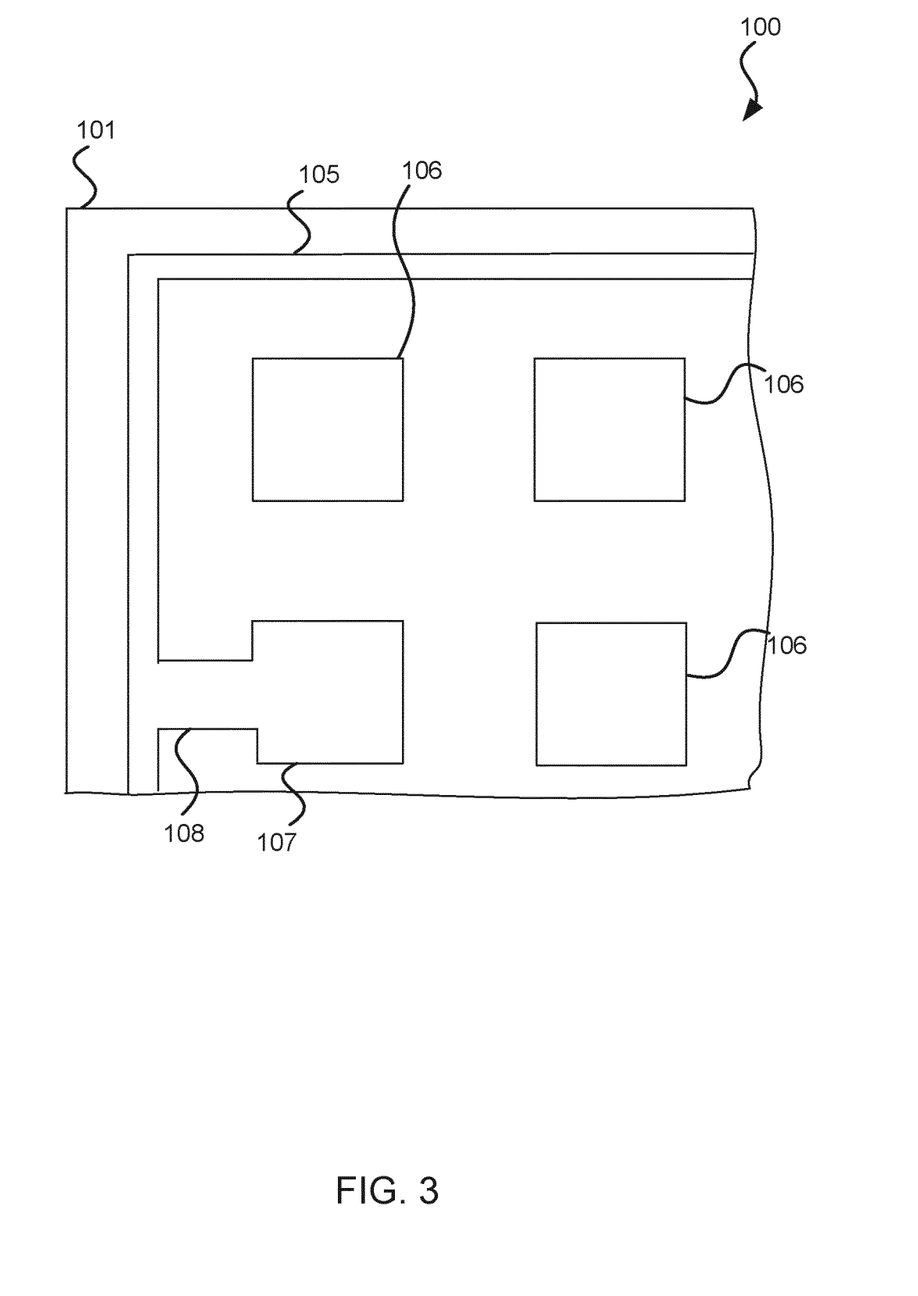
FIG. 3 illustrates a schematic representation of a top view of a tile corner according to an embodiment.

FIG. 3 illustrates a schematic representation of a top view of the tile corner according to an embodiment. One of the signal pads 106, one pixel, has been replaced by the guard ring pad 107. Thus, instead of the signal pad 106, the guard ring contact pad 107 is situated at this location. Furthermore, the guard ring pad 107 is connected to the guard ring by a connection 108. In FIG. 3 the guard ring 105 may be situated closer to the edge of the tile 101 as compared to the configuration of FIG. 2.

Figure 4:
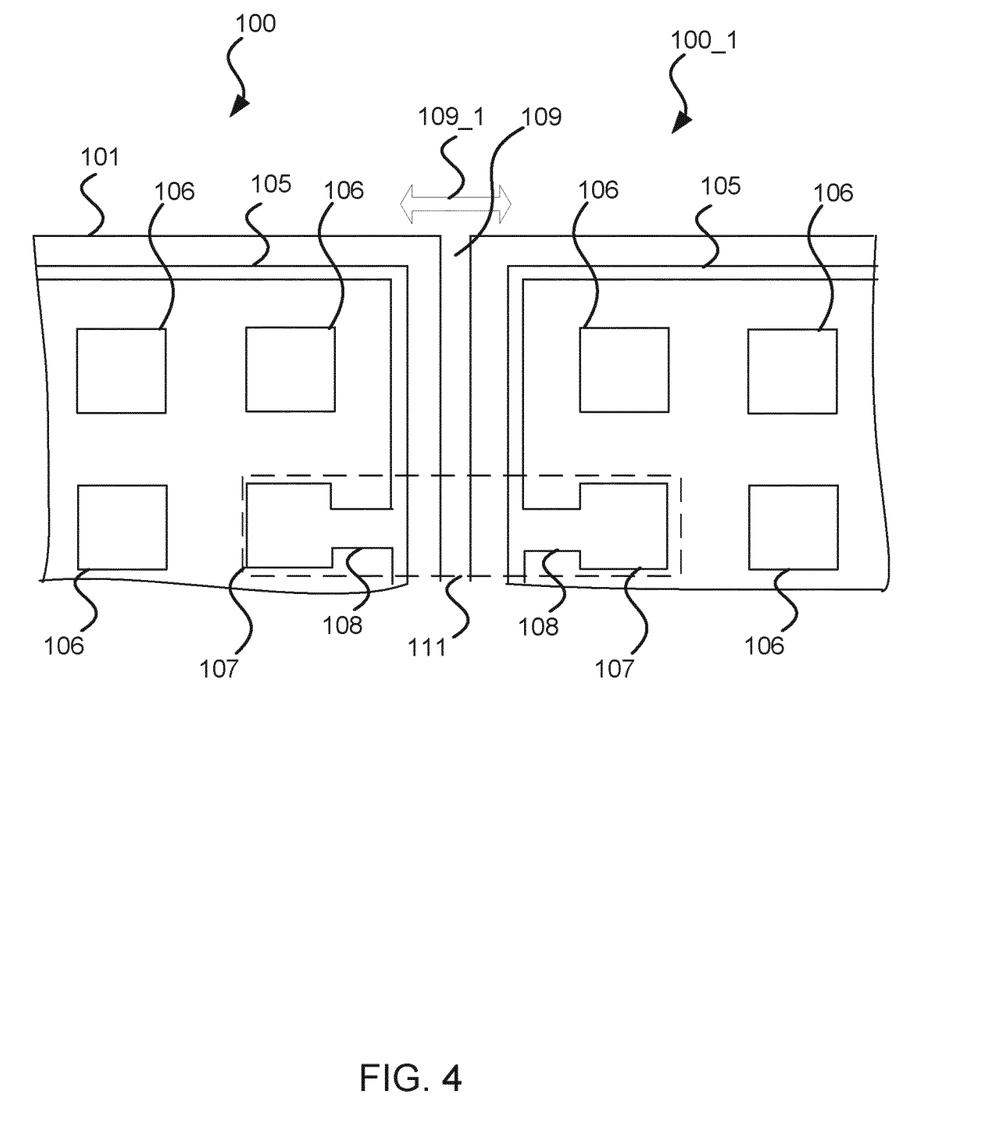
FIG. 4 illustrates a schematic representation of a top view of tiles and a gap between the tiles according to a comparative example.

FIG. 4 illustrates a schematic representation of a top view of tiles 100, 100_1 and a gap 109 between the tiles 100, 100_1 according to a comparative example. In the comparative example the guard ring contact pads 107 are symmetric with respect to the symmetry axes of the tile 100,100_1. Consequently, the pads 107 are side by side having only the gap 109 between them. The gap 109 and the edges of the tile 100, 101_1 establish a dead area 109_1, which may approximately correspond to an area of one pixel. In the comparative example, a cluster 111 of the three dead pixels is established by the pads 107 and the dead zone 109_1, as illustrated by the dashed box 110.

Figure 5:
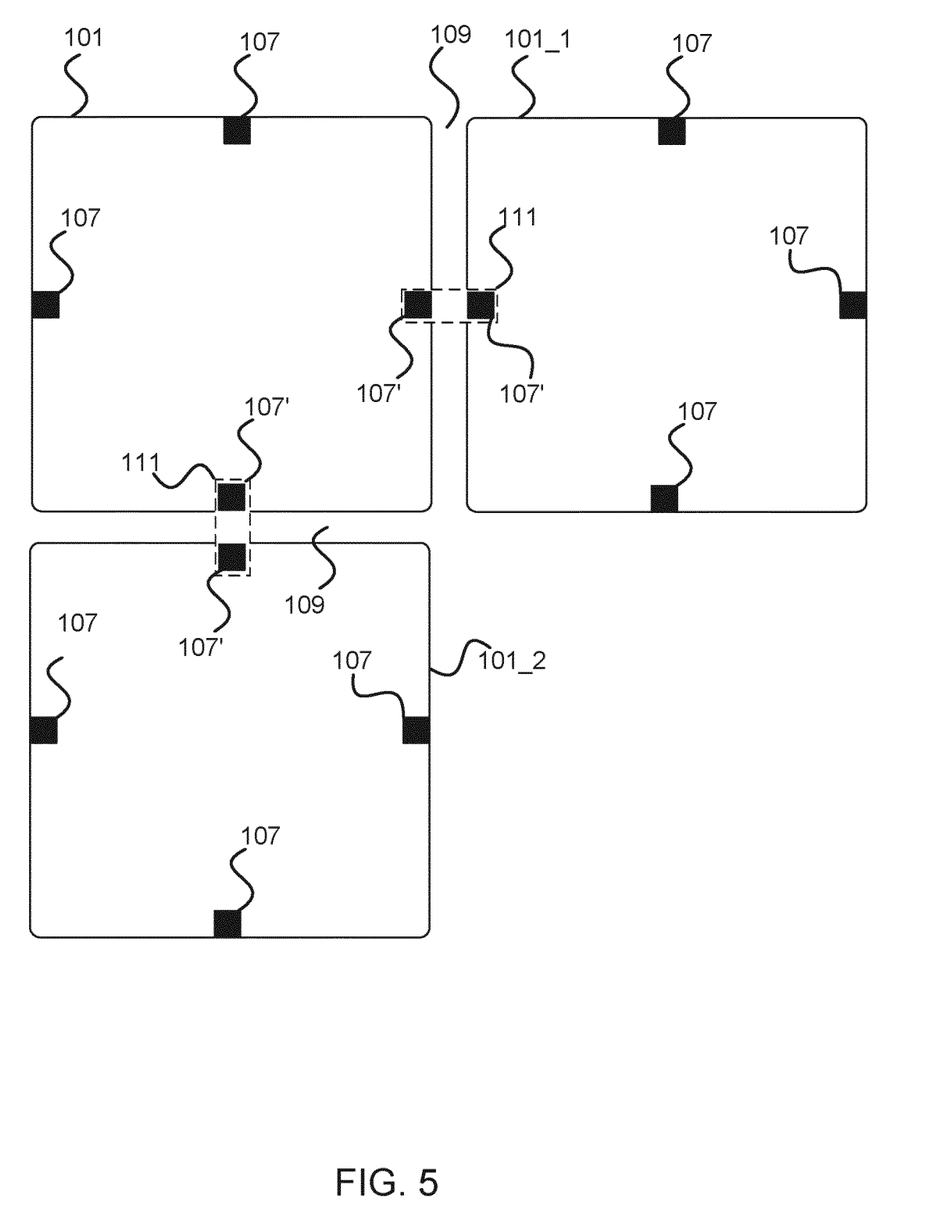
FIG. 5 illustrates a schematic representation of a top view of tiles having dead pixels and gaps between the tiles according to another comparative example.

FIG. 5 illustrates a schematic representation of a top view of direct conversion compound semiconductor layers 101, 101_1, 101_2 having a cluster 111 of the dead pixels and the gaps 109 between the tiles according to another comparative example. The comparative example illustrates the cluster 111 of the three consecutive dead pixels between the tiles horizontally and vertically. In the comparative example the ground ring contact pads 107 are configured symmetrically at the tile, and consequently there is always the cluster 111 between the tiles. This may significantly reduce the performance of this kind of detector.

Figure 6:
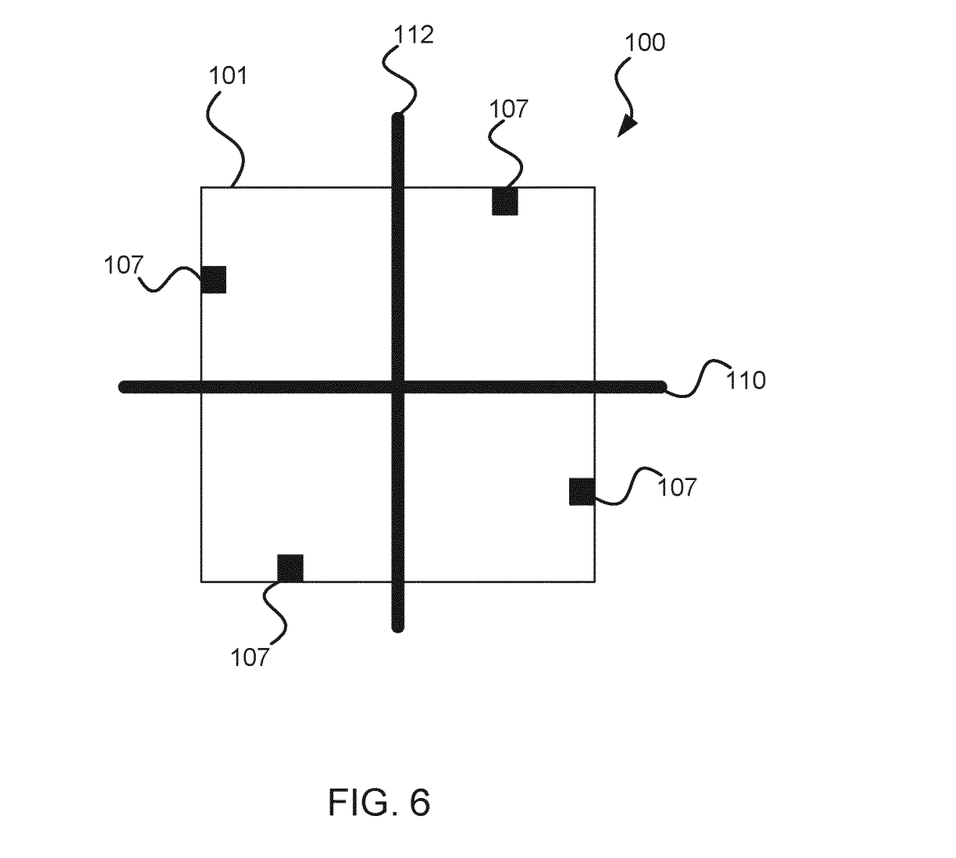
FIG. 6 illustrates a schematic representation of a top view of a tile showing asymmetrically positioned dead pixels with respect to symmetry axes according to an embodiment.

FIG. 6 illustrates a schematic representation of a top view of a tile 100 showing asymmetrically positioned dead pixels 107 with respect to symmetry axes 110, 112 according to an embodiment.

The tile 100 comprises four guard ring contact pads 107 so that each side of the tile 100 has one pad 107. The guard ring contact pads 107 are situated asymmetrically with respect to the symmetry x-axis 110. The guard ring contact pads 107 are also situated asymmetrically with respect to the symmetry y-axis 112.

When the tile 100 is assembled on the detector and placed next to the other tiles, the guard ring contact pads 107 are not situated side by side because they are configured asymmetrically. Furthermore, as each of the sides of the tile 100 still has the guard ring contact pad 107, reliability, configuration and functionality of the guard ring 105 may be improved. There is no cluster 111 of three dead pixels. Furthermore, when assembling the detector the tile 100 may be rotated by 360 degrees with respect to the top view, so that any side of the tile 100 may be placed next to another similar tile, which reduces costs and complexity of the manufacturing process. Furthermore, this increases the speed of the manufacturing process of the detector.

Figure 7:
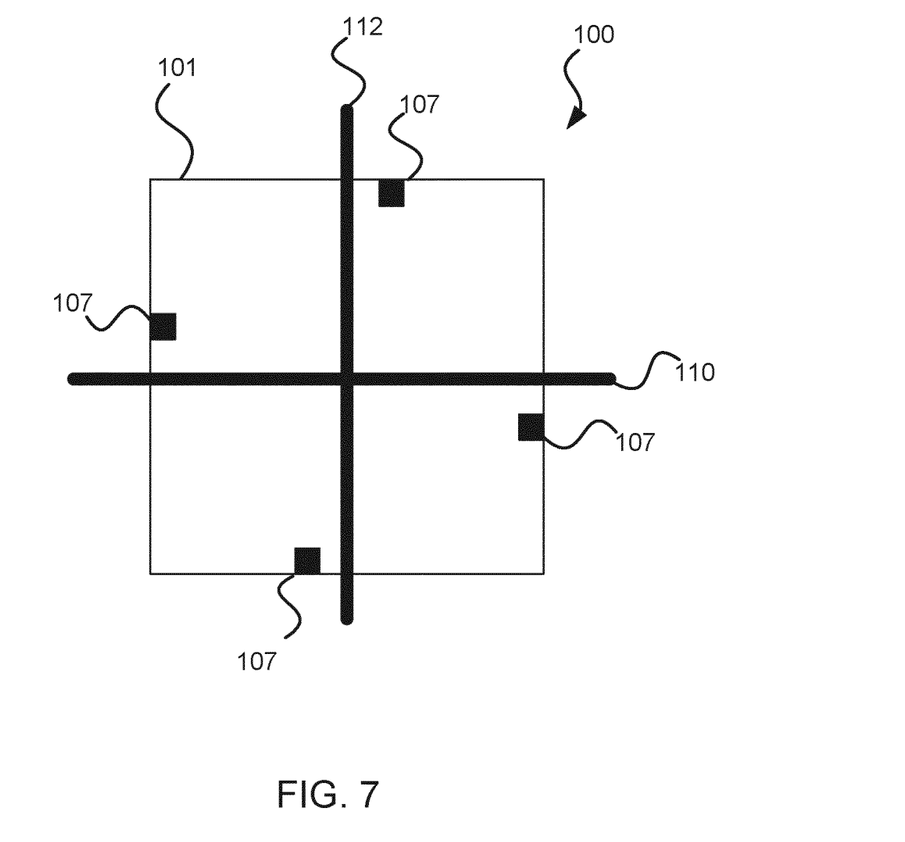
FIGS. 7 and 8 illustrate other embodiments for configuring guard ring contact pads into a tile.
Figure 8:
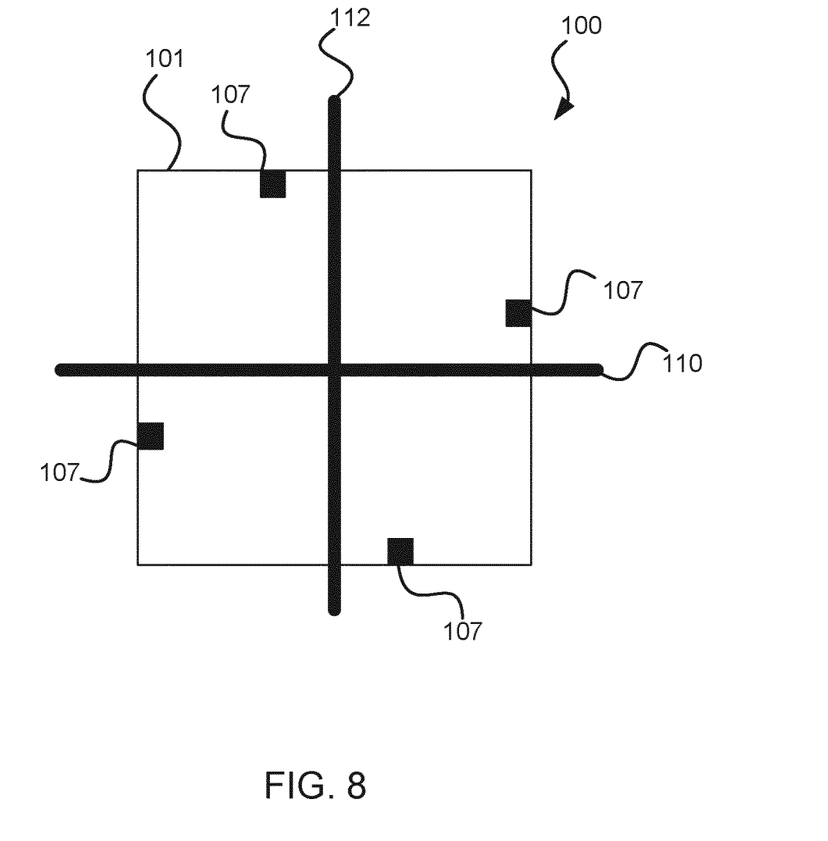

FIGS. 7 and 8 illustrate other embodiments for configuring guard ring contact pads 107 onto a tile 100. The pads 107 are asymmetric with respect to the x and y symmetry axes 110, 112. The distances between the pads 107 and the symmetry axes 110, 112 may vary, and some embodiments have been illustrated.

Figure 9:
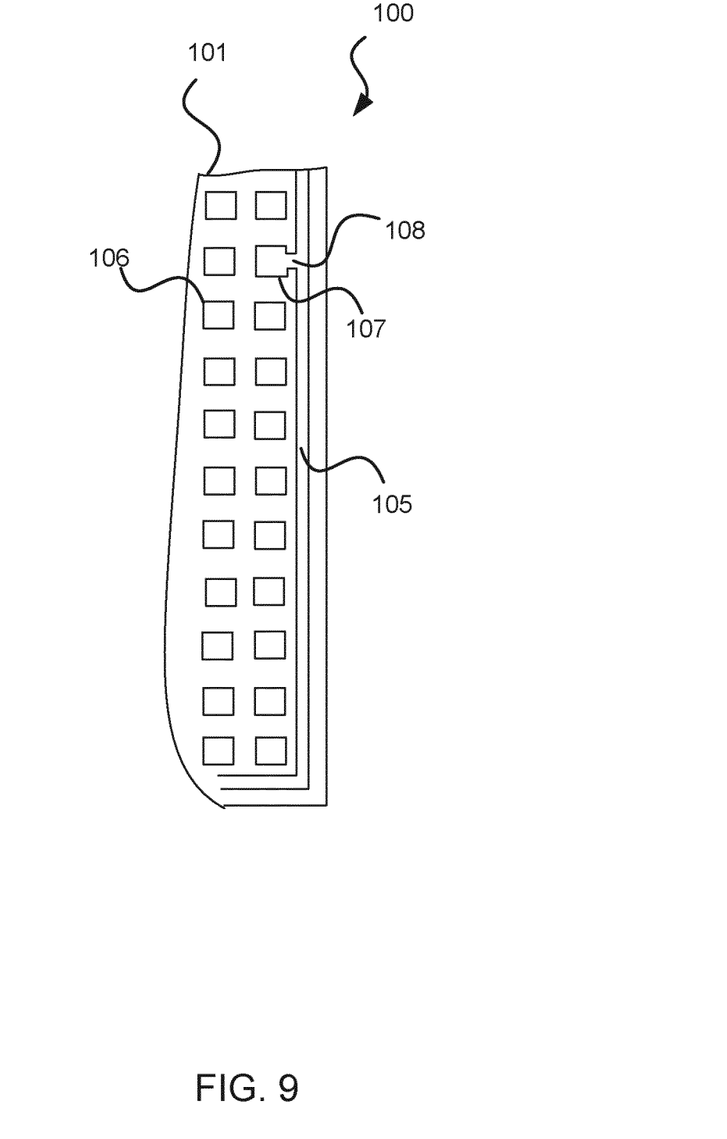
FIG. 9 illustrates a schematic representation of a top view of a portion of a tile according to an embodiment.

It should be noted that although embodiments of FIGS. 6, 7 and 8 illustrate that guard ring contact pads 107 situated at the edge of the direct conversion compound semiconductor layer 101, the guard ring 105 is situated between the pad 107 and the edge, for example as illustrated in FIGS. 3 and 9.

FIG. 9 illustrates a schematic representation of a top view of a portion of a tile 100 according to an embodiment. The embodiment of FIG. 9 is similar to the embodiment of FIG. 3. The guard ring contact pad 107 is situated next to the guard ring 105 and connected by a connection 108 at a position of the pixel 106 which is being replaced by the pad 107. The symmetry axes 110, 112 are not shown in FIG. 9; however, they may be implemented according to the embodiments of FIGS. 6, 7 and/or 8.

Figure 10:
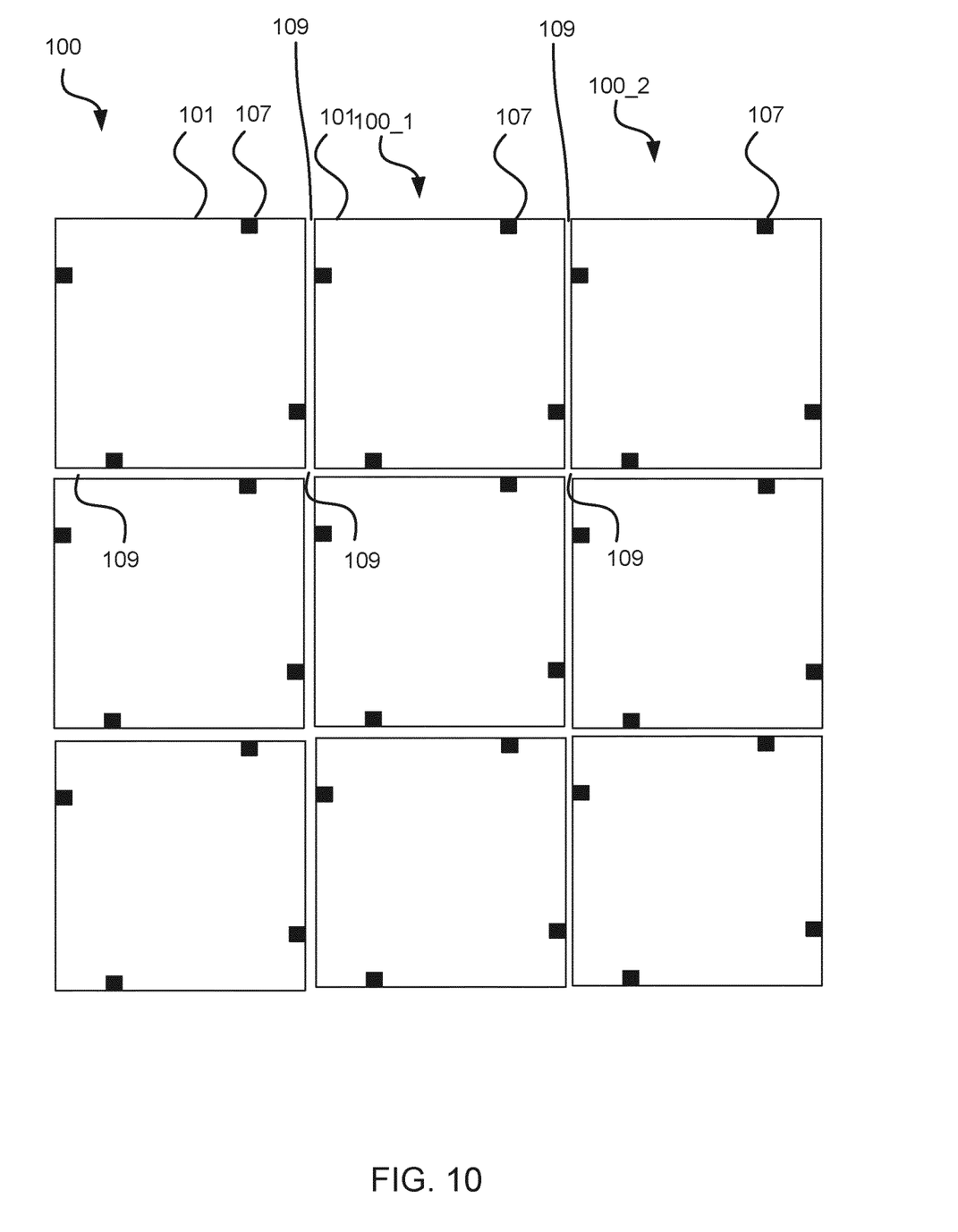
FIG. 10 illustrates a schematic representation of a top view of an array of tiles and gaps between the tiles having asymmetrically positioned dead pixels according to an embodiment.

FIG. 10 illustrates a schematic representation of a top view of an array of tiles 100 and gaps 109 between the tiles having asymmetrically positioned dead pixels 107 according to an embodiment. FIG. 10 shows the array of tiles 100 having asymmetrically positioned guard ring contact pads 107. There is no cluster 111 of three or more dead pixels. For two neighboring tiles 100, the dead pixels 107, which are separated by the gap 109, do not occur on the same horizontal or vertical axes, because they are asymmetric (with respect to the symmetry axes of the tile 100). Although FIG. 10 illustrates an array of nine tiles 100, the number of tiles may vary, and nine tiles are only illustrated as an embodiment. Furthermore, the shape of the array may be other than a square as shown in FIG. 10, for example a rectangular, oval or spherical array may be used instead.

Figure 11:
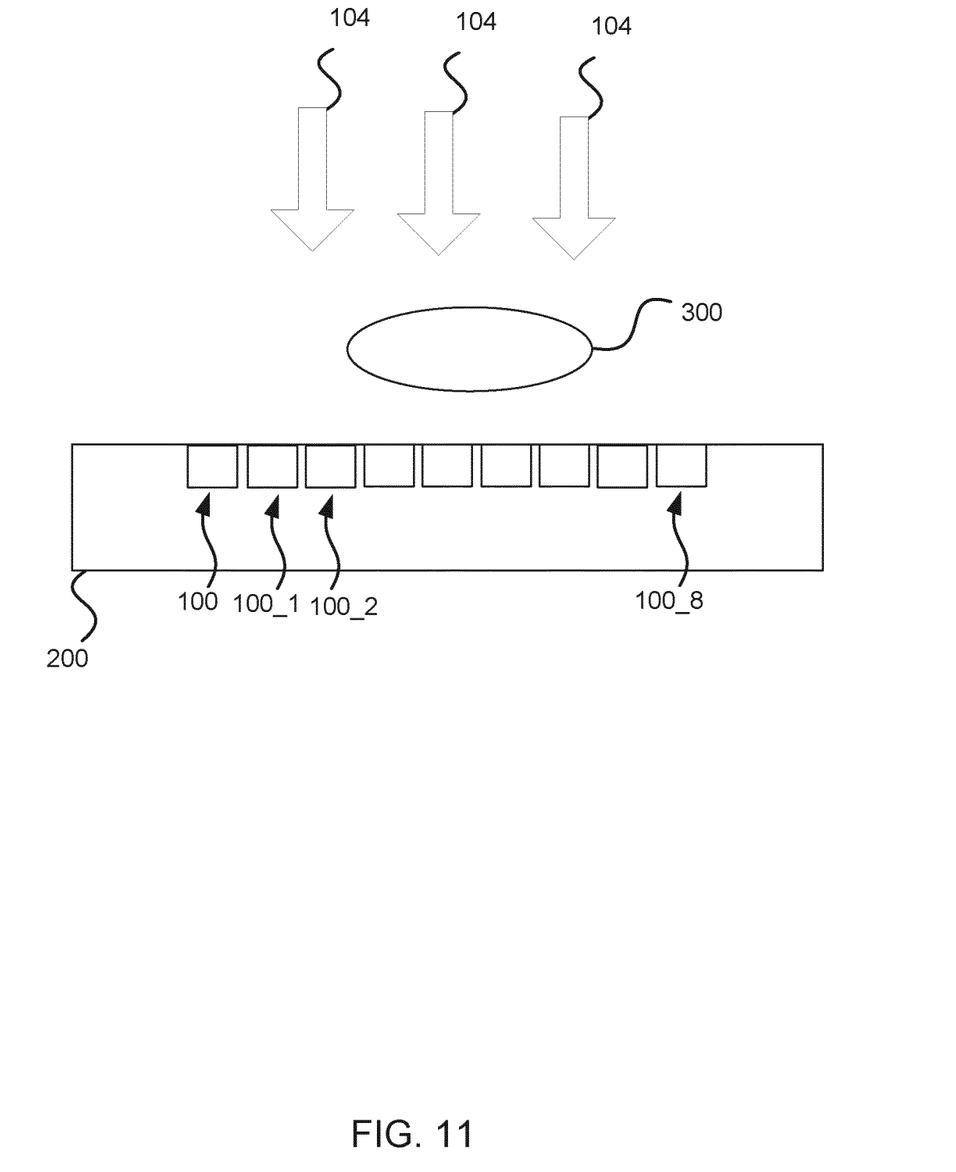
FIG. 11 illustrates a schematic representation of a cross section of a detector having the tiles according to an embodiment.

FIG. 11 illustrates a schematic representation of a cross section of a detector 200 having an array of tiles 100 according to an embodiment. X-ray radiation 104 is emitted from a source (not shown in FIG. 11). An object 300 to be detected and inspected by the x-ray radiation 104 is shown between the radiation source and the detector 200. The detector 200 comprises an array having nine tiles 100-100_8 in the cross section of the detector 200, for example in the x-axis direction.

FIG. 11 illustrates the detection devices 200 comprising a tile 100 having asymmetrically positioned guard ring contact pads 107 according to the embodiments. The device 200 may be a part of an imaging system for detecting the object 300, comprising the tile 100 as described in any of these embodiments. The system may be applied for example in medical imaging, security imaging and/or industrial imaging.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

An embodiment relates to a device, comprising: a direct conversion compound semiconductor layer configured to convert x-ray photons into an electric current, the direct conversion compound semiconductor layer, comprising: a pixel array positioned in the direct conversion compound semiconductor layer, including pixels located at an outermost circumference, wherein the pixels comprise signal pads; a guard ring encircling the pixel array, wherein the pixels at the outermost circumference are closest to the guard ring; guard ring contact pads, wherein the guard ring contact pads are situated in place of some of the pixel signal pads at the outermost circumference and connected to the guard ring; wherein the guard ring contact pads are further situated asymmetrically with respect to a symmetry x-axis and a symmetry y-axis of the direct conversion compound semiconductor layer.

Alternatively or in addition to the above, the guard ring contact pads are situated asymmetrically so that, when another direct conversion compound semiconductor layer is positioned next to the direct conversion compound semiconductor layer, the guard ring contact pads, which are separated by a gap between the layers, are not situated on an x-axis or a y-axis of one of the pads. Alternatively or in addition to the above, the guard ring contact pads are situated asymmetrically so that, when another direct conversion compound semiconductor layer is positioned next to the direct conversion compound semiconductor layer so that the sides of the direct conversion compound semiconductor layers are against each other, the guard ring contact pads situated at the sides are not situated on an x-axis or a y-axis crossing one of the pads. Alternatively or in addition to the above, the direct conversion compound semiconductor layer comprises a semiconductor layer that is configured to be used for high energy photon detection at room temperature. Alternatively or in addition to the above, the direct conversion compound semiconductor layer comprises a cadmium telluride layer or a cadmium zinc telluride layer. Alternatively or in addition to the above, each side of the semiconductor layer includes at least one of the guard ring contact pads. Alternatively or in addition to the above, the guard ring contact pads are configured to ground the guard ring. Alternatively or in addition to the above, the pixels comprise signal pads. Alternatively or in addition to the above, the guard ring contact pad corresponds to a dead pixel in digital imaging. Alternatively or in addition to the above, further including an integrated circuit, IC, layer situated under the direct conversion compound semiconductor layer. Alternatively or in addition to the above, the guard ring contact pads connect the guard ring through the direct conversion compound semiconductor layer to the IC layer. Alternatively or in addition to the above, further including a substrate layer situated under the IC layer.

According to an embodiment, the device comprises a tile, wherein the tile comprises the direct compound semiconductor layer. According to an embodiment, the detector comprises an array of tiles. According to an embodiment, an imaging system, comprising: an x-ray source; and the detector.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, embodiments and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

I claim:

1. A device, comprising:
    a direct conversion compound semiconductor layer configured to convert high energy radiation photons into an electric current, the direct conversion compound semiconductor layer, comprising:
    a pixel array positioned in the direct conversion compound semiconductor layer, including pixels located at an outermost circumference, wherein the pixels comprise signal pads;
    a guard ring encircling the pixel array, wherein the pixels at the outermost circumference are closest to the guard ring; and
    guard ring contact pads situated in the pixel array at the outermost circumference and connected to the guard ring;
    wherein the outermost circumference comprises both the signal pads and the guard ring contact pads;
    wherein the guard ring contact pads are further situated asymmetrically with respect to both a symmetry x-axis and a symmetry y-axis of the direct conversion compound semiconductor layer; and
    wherein the symmetry x-axis comprises a horizontal axis and the symmetry y-axis comprises a vertical axis when viewing the direct conversion compound semiconductor layer from above.

2. The device of claim 1, wherein the device comprises another direct conversion compound semiconductor layer positioned next to the direct conversion compound semiconductor layer.

3. The device according to claim 1, wherein the guard ring contact pad of the direct conversion compound semiconductor layer and the guard ring contact pad of another direct conversion compound semiconductor layer are separated by a gap between the direct conversion compound semiconductor layer and the another direct conversion compound semiconductor layer.

4. The device according to claim 1, wherein the direct conversion compound semiconductor layer comprises a semiconductor layer that is configured to be used for high energy photon detection at room temperature.

5. The device according to claim 1, wherein the direct conversion compound semiconductor layer comprises a cadmium telluride layer or a cadmium zinc telluride layer.

6. The device according to claim 4, wherein each side of the semiconductor layer includes at least one of the guard ring contact pads.

7. The device according to claim 1, wherein the guard ring contact pads are configured to ground the guard ring.

8. The device according to claim 1, further including an integrated circuit (IC) layer situated under the direct conversion compound semiconductor layer.

9. The device according to claim 8, wherein the guard ring contact pads connect the guard ring through the direct conversion compound semiconductor layer to the IC layer.

10. The device according to claim 8, wherein the device further comprises a substrate layer situated under the IC layer.

11. The device according to claim 1, wherein the device comprises a tile, wherein the tile comprises the direct compound semiconductor layer.

12. A detector comprising an array of tiles according to claim 11.

13. An imaging system, comprising:
    a high energy radiation source; and the detector according to claim 12.

14. The device according to claim 1, wherein the direct conversion compound semiconductor layer comprises a semiconductor layer that is configured to be used for high energy photon detection at room temperature.

15. The device according to claim 1, wherein the direct conversion compound semiconductor layer comprises a cadmium telluride layer or a cadmium zinc telluride layer.

16. The device according to claim 14, wherein each side of the semiconductor layer includes at least one of the guard ring contact pads.

17. The device according to claim 1, wherein the guard ring contact pads are configured to ground the guard ring.

18. The device according to claim 1, further including an integrated circuit (IC) layer situated under the direct conversion compound semiconductor layer.

19. The device according to claim 18, wherein the guard ring contact pads connect the guard ring through the direct conversion compound semiconductor layer to the IC layer.

* * * * *